United States Patent
Kishi et al.

(10) Patent No.: US 10,412,834 B2
(45) Date of Patent: Sep. 10, 2019

(54) MOUNTING STRUCTURE AND METHOD FOR MANUFACTURING SAME

(71) Applicant: Panasonic Intellectual Property Management Co., Ltd., Osaka-shi, Osaka (JP)

(72) Inventors: Arata Kishi, Osaka (JP); Hironori Munakata, Osaka (JP); Koji Motomura, Osaka (JP); Hiroki Maruo, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/699,570

(22) Filed: Sep. 8, 2017

(65) Prior Publication Data

US 2017/0374743 A1    Dec. 28, 2017

Related U.S. Application Data

(63) Continuation of application No. 14/396,297, filed as application No. PCT/JP2013/002354 on Apr. 5, 2013, now Pat. No. 9,795,036.

(30) Foreign Application Priority Data

May 10, 2012   (JP) ................................. 2012-108063

(51) Int. Cl.
H05K 1/18      (2006.01)
H05K 3/34      (2006.01)
H01L 23/00     (2006.01)

(52) U.S. Cl.
CPC ............. *H05K 1/181* (2013.01); *H01L 24/16* (2013.01); *H01L 24/17* (2013.01); *H01L 24/32* (2013.01);
(Continued)

(58) Field of Classification Search
CPC ...... H05K 1/181; H05K 3/3463; H01L 24/16; H01L 24/17; H01L 24/73
(Continued)

(56) References Cited

U.S. PATENT DOCUMENTS 6,559,390 B1    5/2003   Tanaka
8,450,859 B2    5/2013   Ohashi et al.
(Continued)

FOREIGN PATENT DOCUMENTS

CN    101965632    2/2011
CN    102349362    2/2012
(Continued)

OTHER PUBLICATIONS

Japanese Office Action, Japanese Patent Application No. 2014-514363, dated Jan. 16, 2017 (4 pages) (Year: 2017).*
(Continued)

*Primary Examiner* — Eric W Thomas
*Assistant Examiner* — Arun Ramaswamy
(74) *Attorney, Agent, or Firm* — Hamre, Schumann, Mueller & Larson, P.C.

(57) ABSTRACT

A mounting structure includes a bonding material (106) that bonds second electrodes (104) of a circuit board (105) and bumps (103) of a semiconductor package (101), the bonding material (106) being surrounded by a first reinforcing resin (107). Moreover, a portion between the outer periphery of the semiconductor package (101) and the circuit board (105) is covered with a second reinforcing resin (108). Even if the bonding material (106) is a solder material having a lower melting point than a conventional bonding material, high drop resistance is obtained.

8 Claims, 7 Drawing Sheets

(52) U.S. Cl.
CPC .............. *H01L 24/73* (2013.01); *H01L 24/81* (2013.01); *H01L 24/83* (2013.01); *H01L 24/92* (2013.01); *H05K 3/3436* (2013.01); *H05K 3/3463* (2013.01); *H01L 24/13* (2013.01); *H01L 24/29* (2013.01); *H01L 2224/10156* (2013.01); *H01L 2224/16238* (2013.01); *H01L 2224/293* (2013.01); *H01L 2224/2929* (2013.01); *H01L 2224/32052* (2013.01); *H01L 2224/32057* (2013.01); *H01L 2224/32225* (2013.01); *H01L 2224/73203* (2013.01); *H01L 2224/81052* (2013.01); *H01L 2224/8159* (2013.01); *H01L 2224/81191* (2013.01); *H01L 2224/81609* (2013.01); *H01L 2224/81611* (2013.01); *H01L 2224/81613* (2013.01); *H01L 2224/81639* (2013.01); *H01L 2224/81647* (2013.01); *H01L 2224/81815* (2013.01); *H01L 2224/81935* (2013.01); *H01L 2224/81951* (2013.01); *H01L 2224/81986* (2013.01); *H01L 2224/83104* (2013.01); *H01L 2224/83192* (2013.01); *H01L 2224/9211* (2013.01); *H01L 2224/92125* (2013.01); *H01L 2924/00014* (2013.01); *H01L 2924/014* (2013.01); *H01L 2924/0132* (2013.01); *H01L 2924/0133* (2013.01); *H01L 2924/01322* (2013.01); *H01L 2924/384* (2013.01); *H05K 3/3484* (2013.01); *H05K 2201/10734* (2013.01); *H05K 2201/10977* (2013.01); *H05K 2201/10992* (2013.01); *H05K 2201/2009* (2013.01); *H05K 2201/2036* (2013.01); *H05K 2201/2045* (2013.01); *Y02P 70/613* (2015.11)

(58) Field of Classification Search
USPC ........ 438/106, 118; 257/737, 738, 734, 779; 174/259
See application file for complete search history.

(56) References Cited

U.S. PATENT DOCUMENTS

| | | |
|---|---|---|
| 8,557,630 B2 | 10/2013 | Sakemi |
| 2002/0033525 A1 | 3/2002 | Ohuchi |
| 2002/0089067 A1 | 7/2002 | Crane et al. |
| 2004/0046252 A1 | 3/2004 | Fujimori et al. |
| 2010/0276803 A1 | 11/2010 | Higuchi et al. |
| 2012/0030913 A1 | 2/2012 | Uehara et al. |
| 2012/0052633 A1 | 3/2012 | Sakemi |
| 2012/0309133 A1 | 12/2012 | Wada et al. |

FOREIGN PATENT DOCUMENTS

| | | |
|---|---|---|
| JP | 10-101906 | 4/1998 |
| JP | 3019851 B | 1/2000 |
| JP | 2000-188469 | 7/2000 |
| JP | 2003-010811 | 1/2003 |
| JP | 2005-026502 | 1/2005 |
| JP | 2006-199937 | 8/2006 |
| JP | 2008-166377 | 7/2008 |
| JP | 2010-272557 | 12/2010 |
| JP | 2012-69839 | 4/2012 |
| WO | 2010050185 | 5/2010 |
| WO | 2012042809 | 5/2012 |

OTHER PUBLICATIONS

Office Action issued in Chinese Patent Application No. 201380018441.8 dated Jul. 15, 2016 (Year: 2016).*

European Search Report, dated Jun. 22, 2015; European Patent Application No. 13787864.1 (7 pages) (Year: 2015).*

Machine translation of Office Action issued in Japanese Patent Application No. 2014-514363, dated Jan. 16, 2017 (4 pages).

Machine translation of Office Action issued in Chinese Patent Application No. 201380018441.8 dated Jul. 15, 2016 (10 pages).

* cited by examiner

FIG. 1
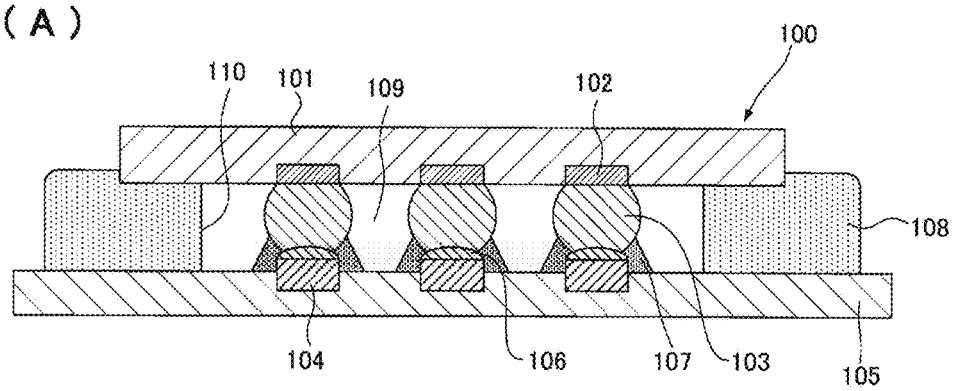
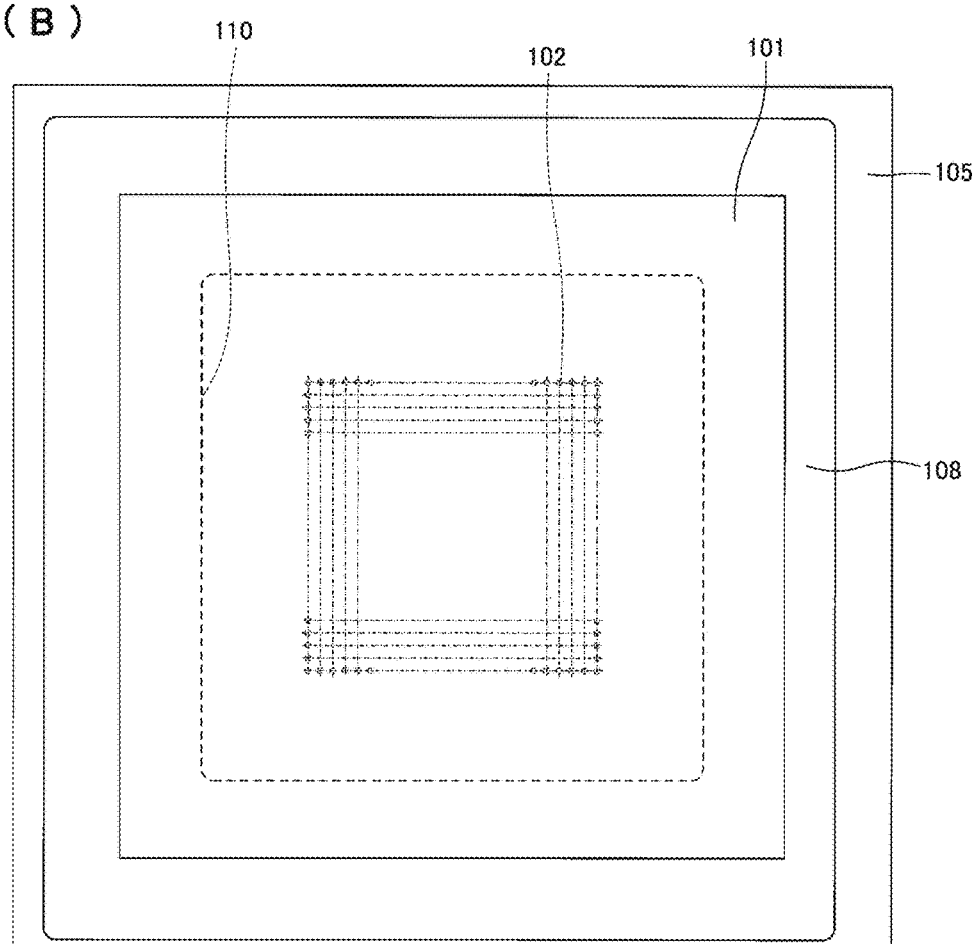

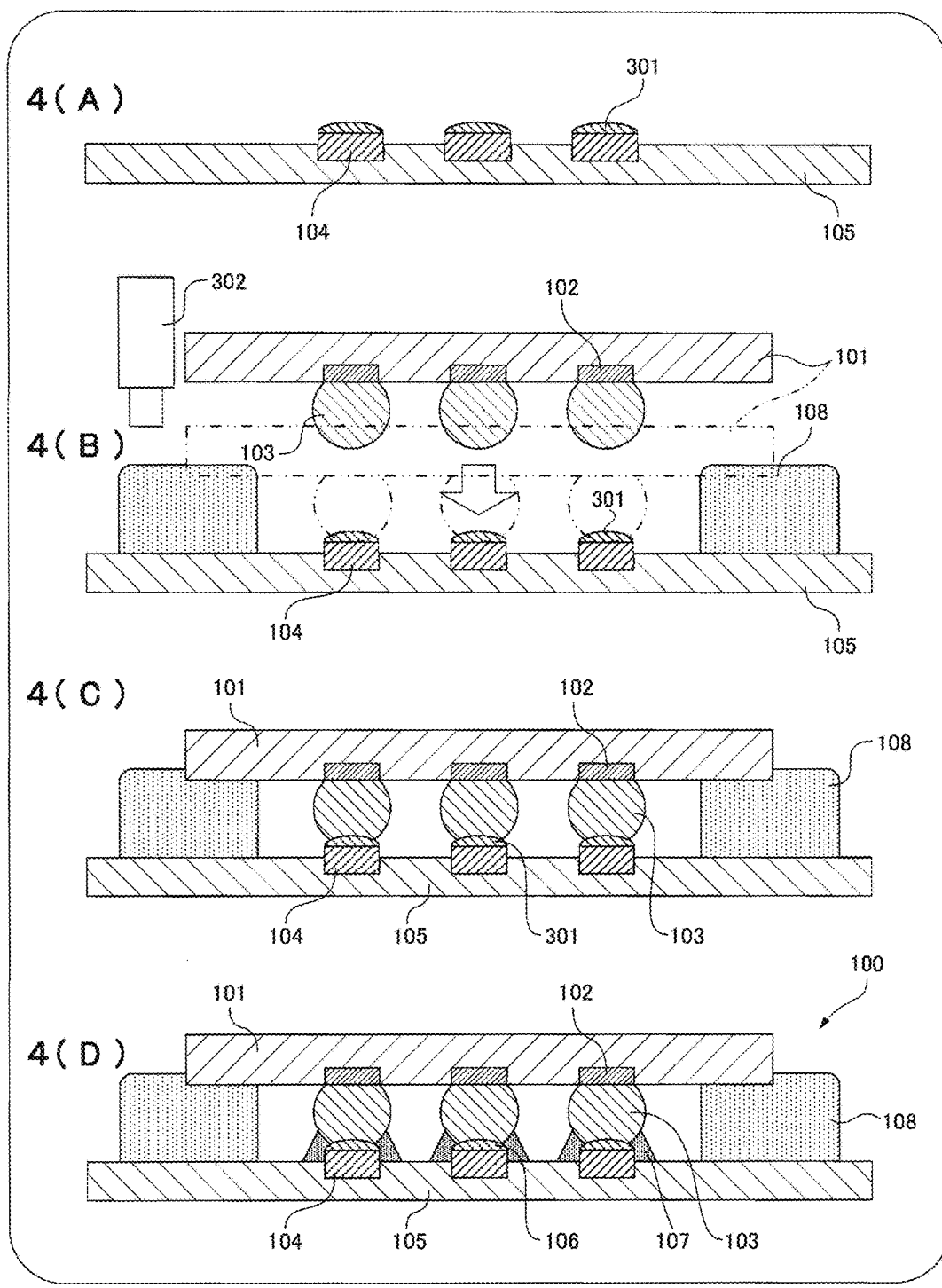

FIG. 6
PRIOR ART
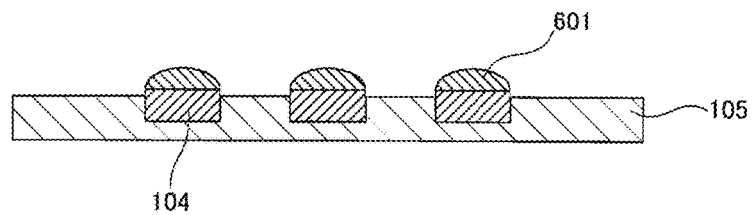
6(A)
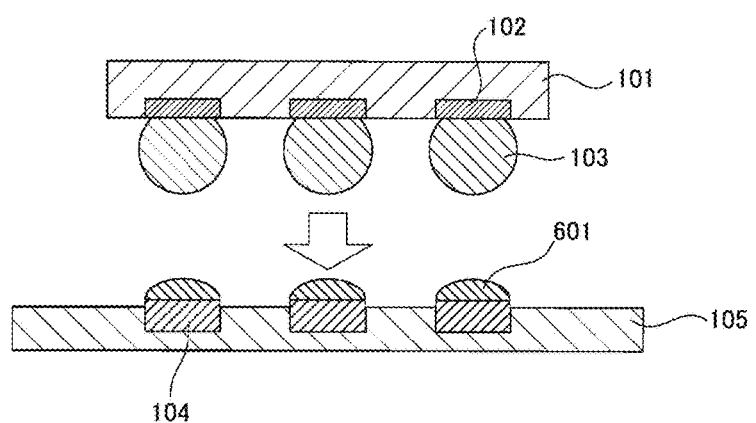
6(B)
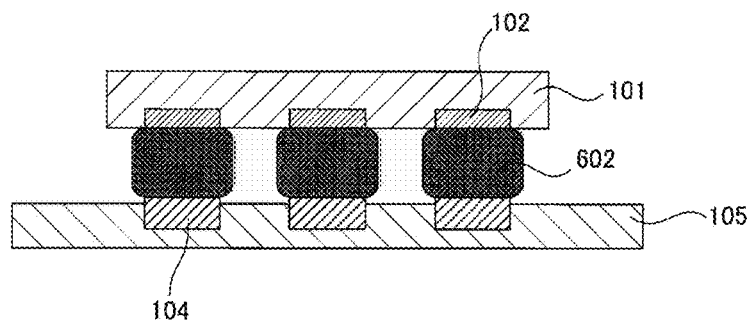
6(C)
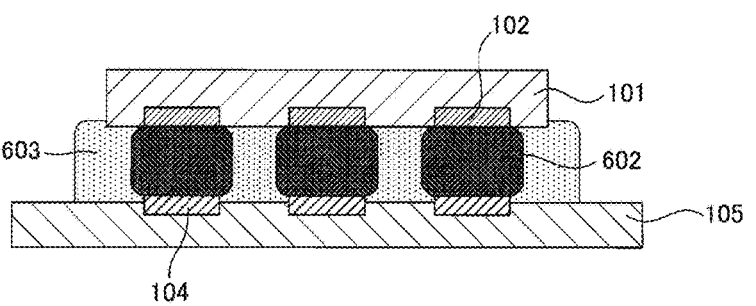
6(D)

MOUNTING STRUCTURE AND METHOD FOR MANUFACTURING SAME

TECHNICAL FIELD

The present invention relates to a mounting structure including a semiconductor package component surface-mounted on a circuit board, and a method for manufacturing the same.

BACKGROUND ART

As in a conventional BGA (Ball Grid Array) and CSP (Chip Scale Package), a semiconductor package component having bumps on the undersurface is mounted according to the process shown in FIGS. 6(A) to 6(D).

In FIG. 6(A), SnAgCu solder paste 601 is printed on second electrodes 104 of a circuit board 105. Subsequently, as shown in FIG. 6(B), bumps 103 formed on first electrodes 102 of a semiconductor package 101 are mounted in contact with the second electrodes 104 through the SnAgCu solder paste 601.

In FIG. 6(C), reflowing is performed. Reflowing melts the SnAgCu solder paste 601 printed on the second electrodes 104 and the solder of the bumps 103 formed on the first electrodes 102, moving the semiconductor package 101 to a proper position by self alignment. After that, the solder at its melting temperature or lower is solidified into solder 602, completing an electrical connection of the semiconductor package 101 to the circuit board 105. At this point, the SnAgCu solder paste 601 printed on the second electrodes 104 has the same composition as the bumps 103 of the semiconductor package 101. Generally, SnAgCu solder is used.

The semiconductor package 101 having the bumps on the undersurface as in a EGA or a CSP is used for mobile devices such as a cellular phone. A function required for such products is drop impact resistance. As a for example, if a EGA and the circuit board 105 .are soldered to each other, a technique shown in FIG. 6(D) is used in which an underfill 603 is filled between the semiconductor package 101 and the circuit board 105 after soldering with the SnAgCu solder 602, improving the drop resistance of joints (Patent Literature 1).

In recent years, the use of a SnBi solder material having a lower melting point than conventional SnAgCu solder has been examined in response to growing interest in environmental issues, particularly, global warming. However, the connection reliability of EGA connections using low melting solder has not been ensured.

A conventional EGA connection using low melting solder will be described below.

For example, a mounting structure described in Patent Literature 2 is shown in FIG. 7.

The mounting structure includes a semiconductor package 101 having first electrodes 102, a circuit board 105 having second electrodes 104, bumps 103 formed on the first electrodes 102, bonding members 106, each being disposed between the bump 103 and the second electrode 104 so as to electrically connect the first electrode 102 and the second electrode 104 via the bump 103, and a reinforcing resin 107 disposed around each of the bonding members so as to cover a joint between the bump 103 and the bonding member 106 and the bonding member. Adjacent portions of the reinforcing resin 107 are separated so as to prevent contact with each other.

CITATION LIST

Patent Literatures

Patent Literature 1: Japanese Patent Laid-Open No. 10-101906
Patent Literature 2: WO2010/050185

DISCLOSURE OF THE INVENTION

Problems to be Solved by the Invention

The provision of the reinforcing resin 107 in Patent Literature 2 can achieve drop resistance that is at least equivalent to that of conventional SnAgCu solder.

However, unlike in the case where the underfill 603 or the like is fixed between the semiconductor package 101 and the circuit board after soldering with SnAgCu solder, sufficient drop resistance cannot be obtained. In other words, a SnBi solder material having a lower melting point than conventional SnAgCu solder cannot be used for mobile devices such as a cellular phone.

In the case of an underfill material, after soldering with SnAgCu solder, then underfill material is applied using a dispenser and then is cured using a curing oven. Thus, the mounting structure including the underfill material 603 is not preferable in view of environmental issues.

The present invention has been devised to solve the conventional problems. An object of the present invention is to provide an environmentally-friendly mounting structure and a method for manufacturing the same that can improve the drop resistance of a joint and eliminate the need for a curing oven in the use of an underfill material in the mounting structure in which a semiconductor package is electrically connected to a circuit board.

Means for Solving the Problem

A mounting structure according to the present invention includes: a semiconductor package having first electrodes; a circuit board having second electrodes; a bonding material containing solder that is disposed between the second electrode and a bump formed on the first electrode and electrically bonds the bump and the second electrode; a first reinforcing resin covering the circumference of the bonding material; and a second reinforcing resin covering a portion between then outer periphery of the semiconductor package disposed on the circuit board and the circuit board.

A method for manufacturing a mounting structure according to the present invention, the method includes: applying mixed paste of a solder material and an uncured thermosetting resin onto second electrodes on a circuit board; mounting a semiconductor package on the second electrodes of the circuit board via bumps and the mixed paste; applying a reinforcing resin between the outer periphery of the semiconductor package and the circuit board; separating the solder material and the thermosetting resin by heating the circuit board and the semiconductor package; and melting the solder material having a lower melting point than the bump, expanding the solder material with a wet surface to the bump, expanding the thermosetting resin with a wet surface around the solder material and the bump, and then curing the thermosetting resin and the reinforcing resin.

A method for manufacturing a mounting structure according to the present invention, the method includes: applying mixed paste of a solder material and an uncured thermosetting resin onto second electrodes on a circuit board; applying a reinforcing resin to a peripheral region where a semiconductor package is mounted on the circuit board; mounting the semiconductor package onto the mixed paste on the second electrodes of the circuit board via bumps; separating the solder material and the thermosetting resin by heating the circuit board and the semiconductor package; and melting the solder material having a lower melting point than the bump, expanding the solder material with a wet surface to the bump, expanding the thermosetting resin with a wet surface around the solder material and the bump, and then curing the thermosetting resin and the reinforcing resin.

Advantage of the Invention

According to the present invention, the circumference of the bonding material is covered with the first reinforcing resin, and the outer periphery of the semiconductor package and the circuit board are covered with the second reinforcing resin. This can improve the drop resistance of a joint.

BRIEF DESCRIPTION OF THE DRAWINGS

FIG. 1(A) is a cross-sectional view showing a mounting structure according to a first embodiment of the present invention.

FIG. 1(B) is a plan view of the mounting structure according to the first embodiment of the present invention.

FIG. 4(A) is a process drawing of manufacturing of a second embodiment according to the present invention.

FIG. 4(B) is a process drawing of manufacturing of the second embodiment according to the present invention.

FIG. 4(C) is a process drawing of manufacturing of the second embodiment according to the present invention.

FIG. 4(D) is a process drawing of manufacturing of the second embodiment according to the present invention.

FIG. 6(A) is a cross-sectional view of a mounting structure described in Patent Literature 1.

FIG. 6(B) is a cross-sectional view of the mounting structure described in Patent Literature 1.

FIG. 6(C) is a cross-sectional view of the mounting structure described in Patent Literature 1.

FIG. 6(D) is a cross-sectional view of the mounting structure described in Patent Literature 1.

BEST MODE FOR CARRYING OUT THE INVENTION

Figure 2:
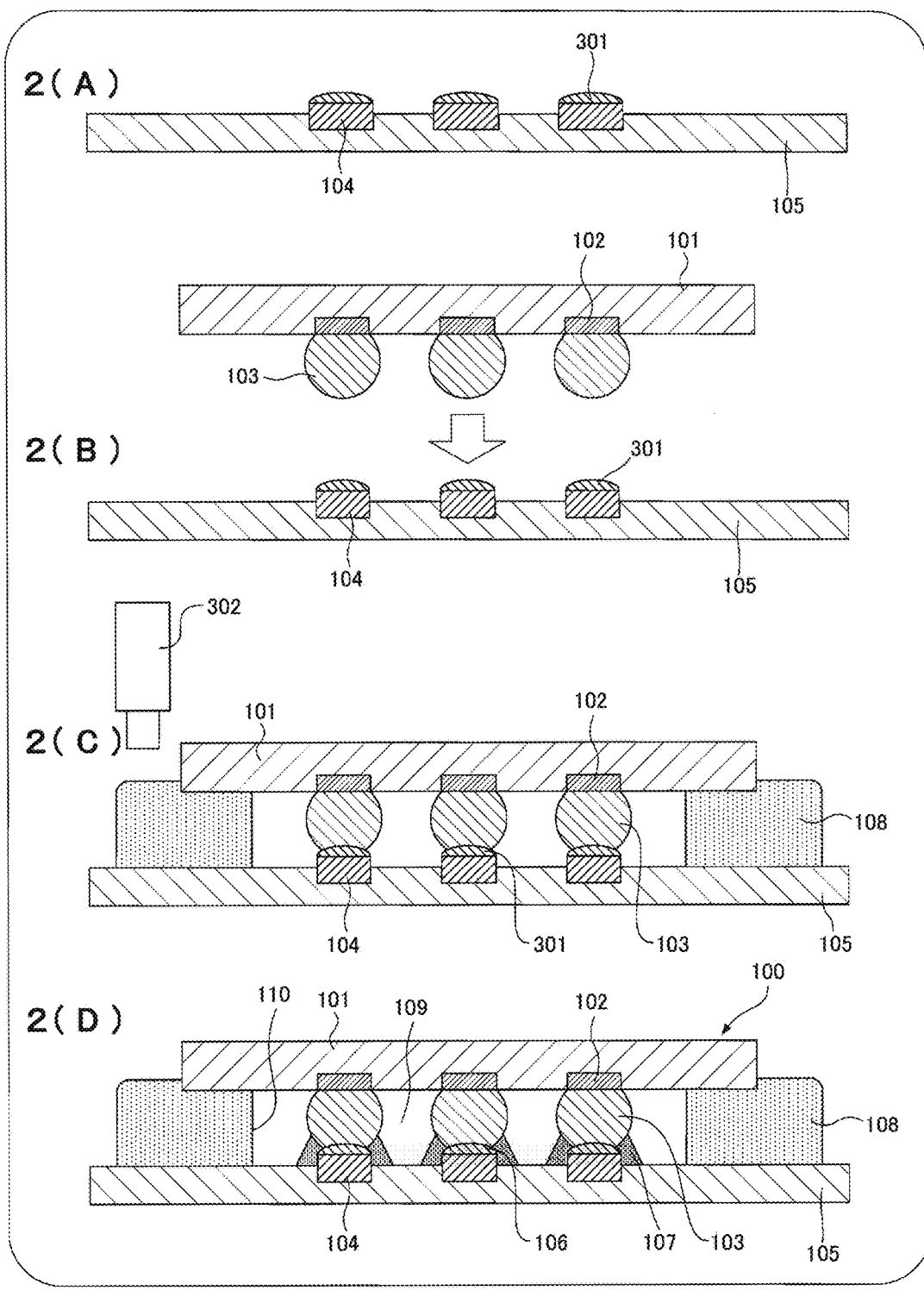
FIG. 2(A) is an explanatory drawing of a manufacturing process according to the first embodiment.
FIG. 2(B) is an explanatory drawing of the manufacturing process according to the first embodiment.
FIG. 2(C) is an explanatory drawing of the manufacturing process according to the first embodiment.
FIG. 2(D) is an explanatory drawing of the manufacturing process according to the first embodiment.

Embodiments of the present invention will be described below with reference to the accompanying drawings.

(First Embodiment)

FIGS. 1(A) and 1(B) show a mounting structure 100 including a semiconductor package 101 mounted on a circuit board 105 according to a first embodiment.

First electrodes 102 of the semiconductor package 101, bumps 103, second electrodes 104 of the circuit board 105 and the like are enlarged relative to the size of the semiconductor package 101. Specifically, for example, the semiconductor package 101 has a size of 11 square millimeters, the bumps 103 are spaced at intervals of 0.5 mm, and the number of bumps is 441. The circuit board 105 is fabricated in conformity with JEDEC Solid State Technology Association standards. The circuit board 105 is 132 mm in length, 77 mm in width, and 1.0 mm in thickness. The electrodes are made of copper while the circuit board is made of a glass epoxy material.

FIGS. 2(A) to 2(D) are explanatory drawings of the manufacturing process of the mounting structure 100.

In FIG. 2(A), mixed paste 301 is printed on the second electrodes 104 of the circuit board 105. The mixed paste 301 is composed of a solder material (will be called a bonding material 106) with an alloy composition of at least two elements selected from the group consisting of Sn, Bi, In, Ag, and Cu and an uncured thermosetting resin (will be called a reinforcing resin 107).

In FIG. 2(B), the semiconductor package 101 is mounted on the circuit board 105 such that the bumps 103 formed on the first electrodes 102 of the semiconductor package 101 and the mixed paste 301 printed on the circuit board 105 are brought into contact with each other.

In FIG. 2(C), a reinforcing resin 108 serving as a second reinforcing resin is applied between the outer periphery of the semiconductor package 101 and the surface of the circuit board 105 by a dispenser 302. After that, in FIG. 2(D), the mixed paste 301 and the reinforcing resin 108 are heated using a reflow device, melting the mixed paste 301. The bonding material 106 and the reinforcing resin 107 serving as a first reinforcing resin are then separated from the mixed paste 301. This connects the first electrode 102 and the second electrode 104 via the bump 103 and the bonding material 106 and covers the boundary of the bonding material 106 and the bump 103 with the reinforcing resin 107. The reinforcing resin 108 covers the outer periphery of the semiconductor package 101 and forms a fillet between the semiconductor package 101 and the circuit board 105. FIG. 1(A) is an enlarged view of FIG. 2(D).

According to the manufacturing method, the bump 103 formed on the first electrode 102 of the semiconductor package 101 and the second electrode 104 of the circuit board 105 are soldered to be connected with the melt-solidified bonding material 106 so as to be electrically connected to each other. The bonding material 106 has an alloy composition with a melting point lower than that of the bump 103. The circumference of the second electrode 104 of the circuit board 105 and the bump 103 are joined to each other so as to be covered with the reinforcing resin 107. Moreover, the outer periphery of the semiconductor package 101 and the circuit board 105 are also joined with the reinforcing resin 108. The reinforcing resin 108 connects the semiconductor package 101 and the circuit board 105 and forms the fillet around the semiconductor package 101.

In the first embodiment, the reinforcing resin 108 covers the outer periphery of the semiconductor package 101 and the circuit board 105 but is not in contact with the bumps 103 formed on the first electrodes of the semiconductor package 101 or the reinforcing resin 107.

Figure 7:
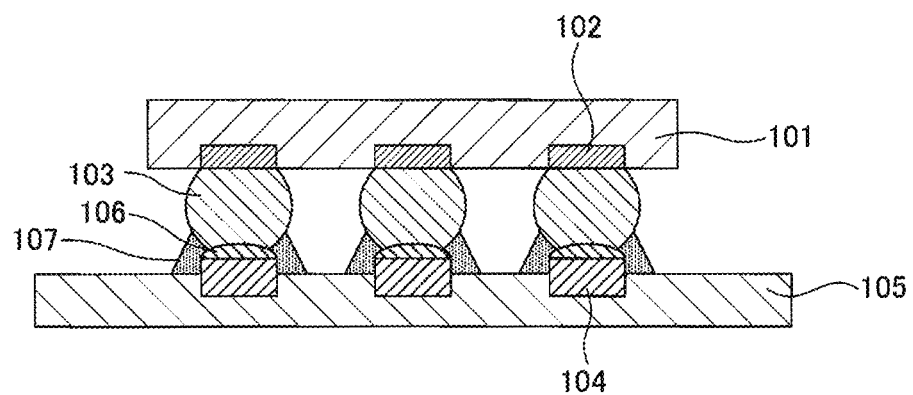
FIG. 7 is a cross-sectional view of a mounting structure described in Patent Literature 2.

With this configuration, the bonding material 106 electrically connecting the first electrode 102 and the second electrode 104 via the bump 103 is reinforced by both of the reinforcing resin 107 and the reinforcing resin 108. More specifically, since the semiconductor package 101 and the circuit board 105 are connected to each other with the fillet formed around the semiconductor package by the reinforcing resin 107, deformation of the circuit board 105 can be suppressed in the event of a mechanical shock such as a drop. Unlike in the conventional example shown in FIG. 7, in which the bonding material 106 is reinforced only by the reinforcing resin 107, the drop resistance of the joints can be improved.

Furthermore, the environmentally-friendly manufacturing method does not require a curing oven in the use of an underfill material. The reinforcing resin 108 is not entirely filled between the semiconductor package 101 and the circuit board 105, forming a space 109 not filled with the reinforcing resin 108. This uses a smaller amount of an underfill resin than in the conventional example of FIG. 6.

The configuration and material specifications of the mounting structure 100 of the semiconductor package 101 will be more specifically described below.

The bumps 103 are desirably composed of a Sn alloy.

For example, the alloy composition can be selected from the group consisting of SnBi, SnIn, SnBiIn, SnAg, SnCu, SnAgCu, SnAgBi, SnCuBi, SnAgCuBi, SnAgIn, SnCuIn, SnAgCuIn, and SnAgCuBiIn alloys.

A Sn alloy is particularly preferable. A Sn alloy has a low melting point of 231° C. and is highly wettable with a Cu electrode, easily forming a compound with other alloys. Moreover, a Sn alloy is inexpensive and possesses low toxicity.

The bonding material 106 may have an alloy composition with a lower melting point than the bump 103. In a preferable example, the bump 103 and the bonding material 106 are preferably composed of the same alloy or a Sn alloy containing the same principal component.

The reinforcing resin 107 and the reinforcing resin 108 contain a resin component as a principal component and a curing agent and further contain a viscosity control thixotropy addition agent if necessary.

The reinforcing resin 107 is a thermosetting resin that contains various resins such as epoxy resin, urethane resin, acrylic resin, polyimide resin, polyamide resin, bismaleimide resin, phenol resin, polyester resin, silicone resin, and oxetane resin. One of the resins may be selected or at least two of the resins may be combined. Among the resins, epoxy resin is preferable.

The reinforcing resin 108 is a thermosetting resin that contains various resins such as epoxy resin, urethane resin, acrylic resin, polyimide resin, polyamide resin, bismaleimide resin, phenol resin, polyester resin, silicone resin, and oxetane resin. One of the resins may be selected or at least two of the resins may be combined. Among the resins, epoxy resin is preferable.

The reinforcing resin 107 and the reinforcing resin 108 are preferably an epoxy resin containing the same resin component. Moreover, only the reaction starting temperatures of the two resins are preferably differentiated by changing only the contained curing agent with the same resin component.

The epoxy resin may be selected from the group consisting of bisphenol epoxy resin, multifunctional epoxy resin, flexible epoxy resin, brominated epoxy resin, glycidyl ester epoxy resin, and polymer epoxy resin. For example, the epoxy resin may be bisphenol-A epoxy resin, bisphenol-F epoxy resin, biphenyl epoxy resin, naphthalene epoxy resin, phenolic novolac epoxy resin, and cresol novolac epoxy resin. The epoxy resin may be modified. One of the resins may be selected or at least two of the resins may be combined.

The curing agent combined with the thermosetting resin may be a compound selected from the group consisting of a thiol compound, an amine compound, a multifunctional phenol compound, an imidazole compound, and an acid anhydride compound. One of the compounds may be selected or at least two of the compounds may be combined.

The viscosity control/thixotropy addition agent may be inorganic or organic as necessary. For example, silica or alumina is used as an inorganic agent while a derivative of amide, polyester, castor oil, and so on is used as an organic agent. One of the agents may be selected or at least two of the agents may be combined.

(Example)

In an example of the present invention, the kind of the mixed paste 301 of a solder material and an uncured thermosetting resin, the reinforcing resin 108, and a reflow achievable temperature were changed to examine the acceptability of electrical continuity and the influence of drop resistance. Table 1 shows the results.

TABLE 1

| | Semiconductor package 101 | Mixed paste 301 of solder material and uncured thermosetting resin | | Reinforcing resin 108 | |
|---|---|---|---|---|---|
| | Solder bump composition 103 (Melting Point) | Solder composition (Melting point) | Curing agent for uncured thermosetting resin (Reaction starting temperature) | Curing agent for reinforcing resin (Reaction starting temperature) | Electrical continuity |
| Example 1 | SnAgCu (217° C.) | SnBi (138° C.) | 2P4MHZ-PW (140° C.) | 2P4MHZ-PW (140° C.) | OK (9.9Ω) |

TABLE 1-continued

| | Semiconductor package 101 | Mixed paste 301 of solder material and uncured thermosetting resin | | Reinforcing resin 108 | |
|---|---|---|---|---|---|
| | Solder bump composition 103 (Melting Point) | Solder composition (Melting point) | Curing agent for uncured thermosetting resin (Reaction starting temperature) | Curing agent for reinforcing resin (Reaction starting temperature) | Electrical continuity |
| Example 2 | SnAgCu (217° C.) | SnBi (138° C.) | 2P4MHZ-PW (140° C.) | 2PHZ-PW (155° C.) | OK (9.8Ω) |
| Example 3 | SnAgCu (217° C.) | SnBi (138° C.) | 2PHZ-PW (155° C.) | 2PHZ-PW (155° C.) | OK (10Ω) |
| Comparative Example 1 | SnAgCu (217° C.) | SnBi (138° C.) | 2MA-OK (130° C.) | 2P4MHZ-PW (140° C.) | NG (18Ω) |
| Comparative Example 2 | SnAgCu (217° C.) | SnBi (138° C.) | 2P4MHZ-PW (140° C.) | 2MA-OK (130° C.) | NG (23Ω) |

OK: OK in Electrical continuity
NG: NG in Electrical continuity

—Material—

In the mixed paste 301 of the solder material and the uncured thermosetting resin, the solder material was 88 parts by weight of Sn58Bi solder while the uncured thermosetting resin was a bisphenol-F epoxy resin (trade name "YDF-7510", Nippon Steel Chemical Co., Ltd.) that is a thermosetting resin.

The viscosity control/thixotropy addition agent was 18 parts by weight of a mixture of a castor-oil thixotropic agent (trade name "THIXCIN R", Elementis Japan KK. (Elementis Specialties, Inc.)), an imidazole curing agent acting as a curing agent, and organic acid ("adipic acid", KANTO CHEMICAL CO., INC.) having a flux effect. At this point, the imidazole curing agent acting as a curing agent was prepared as follows: in the case where the uncured thermosetting resin was prepared such that the epoxy resin and the curing agent had reaction staring temperatures of 130° C., 140° C., and 155° C. relative to the solder material of Sn58Bi having a melting point of 138° C., a 2,4-diamino-6-(2'-methylimidazolyl-(1'))-ethyl-s-triazine isocyanuric acid adduct (trade name "2MA-OK", SHIKOKU CHEMICALS CORPORATION), 2-phenyl-4-methyl-5-hydroxymethylimidazole (trade name "2P4MHZ-PW", SHIKOKU CHEMICALS CORPORATION), and 2-phenyl-4,5-dihydroxymethylimidazole (trade name "2PHZ-PW" SHIKOKU CHEMICALS CORPORATION) were used.

The SnAgCu mixed paste 301 was Sn3.0Ag0.5Cu (trade name "M705-GRN360-L60A", SENJU METAL INDUSTRY CO., LTD.).

The semiconductor package 101 was a semiconductor package including Sn3.0Ag0.5Cu balls serving as the bumps 103 formed on the first electrodes.

The melting point of the Sn58Bi solder was 138° C. while the melting point of the Sn3.0Ag0.5Cu solder was 217° C.

For the reinforcing resin 108, a bisphenol-F epoxy resin (trade name "YDF-7510", Nippon Steel Chemical Co., Ltd.) was used as a thermosetting resin, one of an imidazole curing agent (trade name "2MA-OK", SHIKOKU CHEMICALS CORPORATION) for curing at 130° C., an imidazole curing agent (trade name "2P4MHZ-PW", SHIKOKU CHEMICALS CORPORATION) for curing at 140° C., and an imidazole curing agent (trade name "2PHZ-PW", SHIKOKU CHEMICALS CORPORATION) for curing at 155° C. was used as a curing agent, and a silica thixotropic agent (trade name "AEROSIL RY200", Nippon Aerosil Co., Ltd.) was commonly used as a viscosity control/thixotropy addition agent.

(Evaluation)

The mounting structures were evaluated as follows:

The acceptability of electrical continuity was examined by confirming the presence or absence of electrical continuity with a tester after the fabrication of the mounting structure. In the case of a resistance value of 9.8 to 10Ω, the electrical continuity was denoted as OK, whereas in the case of a resistance value outside this range, the electrical continuity was denoted as NG.

A drop resistance test was evaluated according to a drop resistance life. Specifically, the mounting structure was dropped with an acceleration of 1500 G and a fall time of 0.5 seconds in conformity with JEDEC standards. The drop resistance life was determined when an electrical connection was instantly interrupted. The number of drops before the interruption was set as the drop resistance life. In the evaluation of the instant interruption, when a voltage of 2.0 V applied to the semiconductor package was reduced by 10% or more at the time of dropping the mounting structure, the semiconductor package was evaluated to be unacceptable. At this point, the maximum number of drops was set at 30.

The used semiconductor package had a size of 11 square millimeters. The bumps 103 formed on the first electrodes were spaced at intervals of 0.5 mm, the number of bumps was 441, the circuit board 105 was 132 mm in length, 77 mm in width, and 1.0 mm in thickness. The electrodes were made of copper while the circuit board was made of a glass epoxy material.

(Evaluation Result 1: Continuity Test)

The acceptability of electrical continuity of the mounting structure fabricated by mounting method 1 in FIG. 2 under the conditions of examples 1 to 3 and comparative examples 1 and 2 in Table 1 was evaluated. The evaluation results will be discussed below.

In Table 1, the solder composition of the mixed paste 301 of the solder material and the uncured thermosetting resin was Sn58Bi (melting point: 138° C.). The reaction starting temperatures were changed for the curing agent of the uncured thermosetting resin contained in the mixed paste 301 of the solder material and the uncured thermosetting resin and the curing agent contained in the reinforcing resin 108, and then the mounting structure of the present invention was fabricated. The examination results of material characteristics required at this point are shown in Table 1.

Under the conditions of example 1, the mounting structure 100 was fabricated using the mixed paste 301 of the solder material and the uncured thermosetting resin. The solder composition of the mixed paste 301 of the solder material and the uncured thermosetting resin was Sn58Bi (a melting point of 138° C.). The mounting structure 100 was fabricated using the imidazole curing agent (trade name "2P4MHZ-PW", SHIKOKU CHEMICALS CORPORATION) for curing at 140° C. The mounting structure fabricated using the same curing agent for the reinforcing resin 108 had a resistance value of 9.9Ω. Thus, electrical continuity was confirmed by the tester.

Figure 3A:
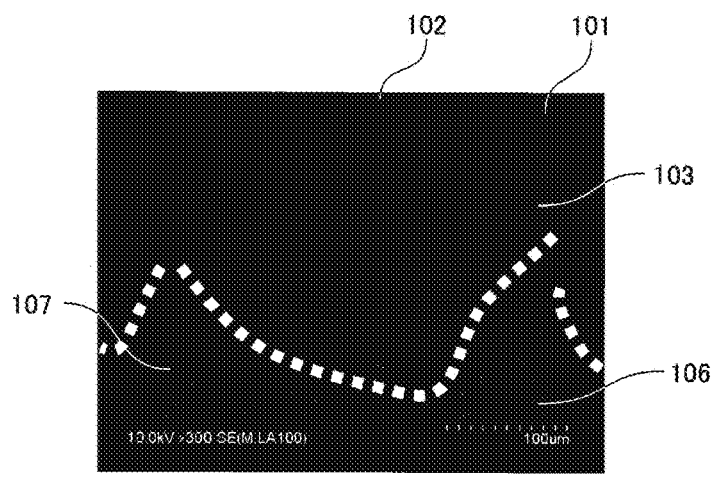
FIG. 3A is a microphotograph of a cross section of the mounting structure fabricated under the conditions of example 1 according to the first embodiment.

FIG. 3A is a microphotograph of a cross section of the mounting structure fabricated under the conditions of example 1. The mounting structure includes the semiconductor package 101, the first electrode 102, the bump 103 formed on the first electrode, the second electrode 104 formed on the circuit board 105, the bonding material 106, and the reinforcing resin 107.

At this point, the bump 103 formed on the first electrode was composed of a Sn3.0Ag0.5Cu solder bump having a melting point of 217° C. Moreover, the reflow achievable temperature was 160° C. in the fabrication of the mounting structure.

This expanded the bonding material 106 with a wet surface to a broken line around the bump 103. Furthermore, it was confirmed that the reinforcing resin 107 formed a fillet shape to a broken line around the bonding material 106.

These results proved that the structure of FIG. 3A was effectively fabricated when the reaction starting temperatures of the curing agents of the uncured thermosetting resin and the reinforcing resin were set at 140° C., which is higher than 138° C., the solder melting point of the mixed paste 301.

Under the conditions of examples 2 and 3, the same results were obtained as in example 1 in the case where the mounting structure was fabricated using the reinforcing resin 108 and the mixed paste 301 of the solder material and the uncured thermosetting resin prepared using the imidazole curing agent (trade name "2P4MHZ-PW", SHIKOKU CHEMICALS CORPORATION) for curing at 140° C., which has a higher reaction starting temperature than the melting point of 138° C. of the Sn58Bi solder or the imidazole curing agent (trade name "2PHZ-PW", SHIKOKU CHEMICALS CORPORATION) for curing at 155° C.

In other words, in the fabrication of the mounting structure of the present invention, it is important that the reaction starting temperatures of the curing agents of the uncured thermosetting resin and the reinforcing resin 108 are higher than the solder melting point of the mixed paste 301 of the solder material and the uncured thermosetting resin.

Subsequently, under the conditions of comparative example 1, the mounting structure was fabricated using the imidazole curing agent (trade name "2MA-OK", SHIKOKU CHEMICALS CORPORATION) for curing at 130° C., the reaction starting temperature of the mixed paste 301 of the solder material and the uncured thermosetting resin relative to 138° C., the solder melting point of the mixed paste 301, and using the imidazole curing agent (trade name "2P4MHZ-PW", SHIKOKU CHEMICALS CORPORATION) for curing at 140° C. for the reinforcing resin 108. Consequently, electrical continuity was not confirmed with a resistance value of 18Ω.

In other words, comparative example 1 is different from example 1 in that the reaction starting temperature of the curing agent of the uncured thermosetting resin is 130° C. and the reaction starting temperature of the reinforcing resin 108 is 140° C. relative to the solder melting point of 138° C.

Figure 3B:
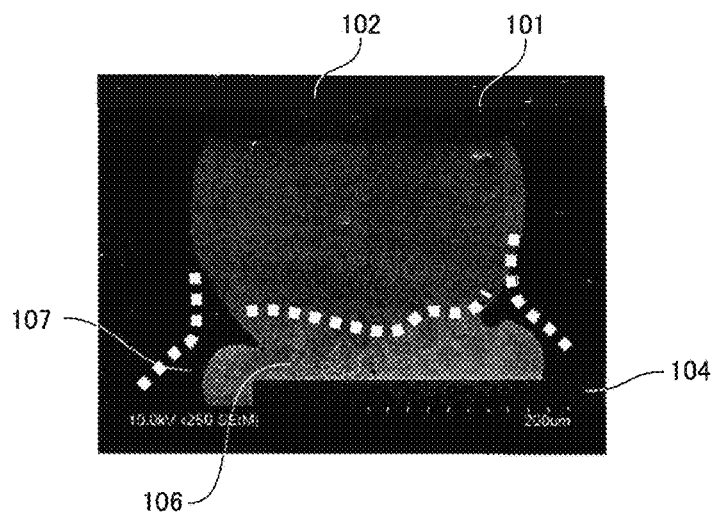
FIG. 3B is a microphotograph of a cross section of the mounting structure fabricated under the conditions of comparative example 1.

FIG. 3B is a microphotograph of a cross section of the mounting structure fabricated under the conditions of comparative example 1. In the observation of the microphotograph, it was confirmed that the reinforcing resin 107 expanded with a wet surface to a broken line around the bump 103 but the bonding material 106 with a wet surface stayed at a broken line without expanding around the bump 103.

Specifically, it was found that electrical continuity could not be confirmed in the mounting structure fabricated under the conditions of comparative example 1 because the uncured thermosetting resin expanded with a wet surface around the bump 103 formed on the first electrode and then was completely cured before the solder material contained in the mixed paste 301 of the solder material and the uncured thermosetting resin expanded with a wet surface around the bump 103 formed on the first electrode.

Under the conditions of comparative example 2, the mounting structure was fabricated using the imidazole curing agent (trade name "2P4MHZ-PW", SHIKOKU CHEMICALS CORPORATION) for curing at 140° C., the reaction starting temperature of the mixed paste 301 of the solder material and the uncured thermosetting resin relative to 138° C., the solder melting point of the mixed paste 301, and using the imidazole curing agent (trade name "2MA-OK", SHIKOKU CHEMICALS CORPORATION) for curing at 130° C. for the reinforcing resin 108. Consequently, electrical continuity was not confirmed with a resistance value of 23Ω.

In other words, comparative example 2 is different from example 1 in that the reaction starting temperature of the curing agent of the uncured thermosetting resin is 140° C. and the reaction starting temperature of the reinforcing resin 107 is 130° C. relative to the solder melting point of 138° C.

Figure 3C:
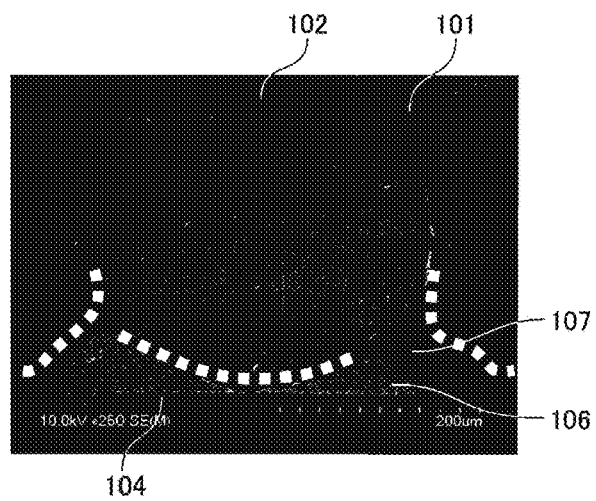
FIG. 3C is a microphotograph of a cross section of the mounting structure fabricated under the conditions of comparative example 2.

FIG. 3C is a microphotograph of a cross section of the mounting structure fabricated under the conditions of comparative example 2. In the observation of the microphotograph, it was confirmed that the reinforcing resin 108 expanded with a wet surface around the bump 103 but the bonding material 106 did not expand with a wet surface.

This is because the reinforcing resin 108 containing the imidazole curing agent (trade name "2MA-OK", SHIKOKU CHEMICALS CORPORATION) for curing at 130° C. was cured before the melting point. (138° C.) of the solder material of the mixed paste 301 containing the solder material and the uncured thermosetting resin. Thus, the semiconductor package 101 did not sink when solder was melted. This increased a distance between molten solder and the bump 103 formed on the first electrode so as to prevent the molten solder from expanding with a wet surface to the bump 103 formed on the first electrode.

—Conclusion of Electrical Continuity Test Results—

The results prove that in the fabrication of the mounting structure of the present invention, the reaction starting temperatures of the uncured thermosetting resin and the reinforcing resin are preferably higher than the melting point of the solder material applied to the circuit board 105.

In the process of fabricating the mounting structure of the present invention, the solder material contained in the mixed paste 301 of the solder material and the uncured thermosetting resin is melted, the solder material expands with a wet surface to the bump 103 formed on the first electrode of the semiconductor package 101, the uncured thermosetting resin expands with a wet surface around the bump 103, and then curing of the uncured thermosetting resin and the reinforcing resin is started and is completed. According to the electrical continuity test results, this process is found to be useful for fabricating the mounting structure of the present invention.

In other words, a point in fabricating the mounting structure of the present invention is that a desirable relationship is established among the melting point of the bump 103 formed on the first electrode of the semiconductor package 101, the melting point of the solder material contained in the mixed paste 301 of the solder material and the uncured thermosetting resin, and the reaction starting temperatures of the thermosetting resin contained in the mixed paste 301 of the solder material and the uncured thermosetting resin and the reinforcing resin 108. The relationship is shown below.

The desirable relationship is: the melting point of the bump 103 formed on the first electrode>the reaction starting temperature for starting curing of the reinforcing resin 108≥the reaction starting temperature of the thermosetting resin in the mixed paste 301>the melting point of the solder material in the mixed paste 301.

A difference between the reaction starting temperature of the reinforcing resin 108 and the reaction starting temperature of the thermosetting reinforcing resin 107 in the mixed paste 301 is preferably 5° C. to 15° C.

The relationship is established to obtain a time for expanding the reinforcing resin 107 with a wet surface to the solder bump and a time for expanding the reinforcing resin 107 with a wet surface around the bump. An extremely large temperature difference may require heat treatment at a high temperature.

A difference between the melting point of the solder material in the mixed paste 301 and the reaction starting temperature of each of the two resins is, for example, 2° C. to 17° C., preferably 10° C. or more. A temperature difference is necessary because melting of the solder material requires a self alignment time for the semiconductor package 101 and the circuit board 105.

An extremely large temperature difference similarly increases a heat treatment temperature over the structure.

—Drop Test—

For example 1 and comparative examples 3 and 4 shown in Table 2, the drop resistance of the mounting structure was evaluated.

TABLE 2

| | Mixed paste 301 of solder material and uncured thermosetting resin | | Reinforcing resin 108 | |
| --- | --- | --- | --- | --- |
| | Solder composition (Melting point) | Curing agent of uncured thermosetting resin (Reaction starting temperature) | Curing agent of reinforcing resin (Reaction starting temperature) | Drop resistance life (Times) |
| Example 1 | SnBi (138° C.) | 2P4MHZ-PW (140° C.) | 2P4MHZ-PW (140° C.) | 30 |
| Comparative Example 3 | SnAgCu (217° C.) | None | None | 5 |
| Comparative | SnAgCu | None | Underfill | 30 |

TABLE 2-continued

| | Mixed paste 301 of solder material and uncured thermosetting resin | | Reinforcing resin 108 | |
| --- | --- | --- | --- | --- |
| | Solder composition (Melting point) | Curing agent of uncured thermosetting resin (Reaction starting temperature) | Curing agent of reinforcing resin (Reaction starting temperature) | Drop resistance life (Times) |
| Example 4 | (217° C.) | | | 603 |

Example 1 is the mounting structure 100 shown in FIG. 1, comparative example 4 is the mounting structure shown in FIG. 6(D), and comparative example 3 is the mounting structure shown in FIG. 6(C).

The drop resistance test was evaluated according to a drop resistance life. Specifically, the mounting structure was dropped with an acceleration of 1500 G and a fall time of 0.5 seconds in conformity with JEDEC standards. The drop resistance life was determined when an electrical connection was instantly interrupted. The number of drops before the interruption was set as the drop resistance life. In the evaluation of the instant interruption, when a voltage of 2.0 V applied to the semiconductor package was reduced by 10% or more when the mounting structure was dropped, the semiconductor package was evaluated to be unacceptable. At this point, the maximum number of drops was set at 30.

The used semiconductor package had a size of 11 square millimeters. The bumps 103 formed on the first electrodes were spaced at intervals of 0.5 mm, the number of bumps was 441, the circuit board 105 was 132 mm in length, 77 mm in width, and 1.0 mm in thickness. The electrodes were made of copper while the circuit board was made of a glass epoxy material.

The mounting structure was fabricated under the conditions of example 1. The drop resistance life was evaluated and was found to be 30 times. At this point, a reflow achievable temperature was 160° C.

The bump 103 at this point was composed of a Sn3.0Ag0.5Cu solder bump having a melting point of 217° C. Moreover, the reflow achievable temperature was 160° C. in the fabrication of the mounting structure. Furthermore, the used mixed paste 301 contained the uncured thermosetting resin and the solder material prepared using the imidazole curing agent (trade name "2P4MHZ-PW", SHIKOKU CHEMICALS CORPORATION) for curing at 140° C. The solder material was SnBi having a melting point of 138° C.

In comparative example 3, the mounting structure shown in FIG. 6(C) was fabricated and evaluated.

In FIG. 6(C), the mounting structure includes the semiconductor package 101, the first electrodes 102, the circuit board 105, the second electrodes 104, and the SnAgCu solder paste 601.

The mounting structure was fabricated as shown in FIG. 6. In FIG. 6, the SnAgCu solder paste 601 was printed on the second electrodes 104 of the circuit board 105 (FIG. 6(A)) and then was mounted in contact with the bumps 103 formed on the first electrodes of the semiconductor package 101 (FIG. 6(B)).

In FIG. 6(C), reflowing was performed. Reflowing melted the SnAgCu solder paste 601 printed on the second electrodes 104 and the solder of the bumps 103 formed on the first electrodes, having moved a semiconductor package component to a proper position by self alignment. After that, solder at its melting temperature or lower was solidified, having completed an electrical connection of the semiconductor package 101 to the circuit board 105. At this point, the SnAgCu solder paste 601 printed on the second electrodes 104 had the same composition as the bumps 103 of the semiconductor package 101. At this point, the reflow achievable temperature was 250° C.

The mounting structure (FIG. 6(C)) was evaluated. The drop resistance life was five times, which is found to be lower than the drop resistance life of comparative example 4.

The mounting structure was fabricated using the underfill 603 in FIG. 6(D) prepared under the conditions of comparative example 4, and then the drop resistance was evaluated. In the mounting structure (FIG. 6(D)), the underfill 603 was applied by a dispenser to the mounting structure (FIG. 6(C)) fabricated according to the method of comparative example 3, and then was cured by heating.

The mounting structure (FIG. 6(D)) was evaluated to have a drop resistance life of 30 times (maximum number of drops), having proved that the mounting structure could obtain the same connection reliability as in example 1.
—Conclusion of Drop Test Results—

The results prove that the mounting structure fabricated under the conditions of example 1 (the mounting structure in FIG. 1) provides the same connection reliability as a conventional mounting structure fabricated by bonding a semiconductor package component and a circuit board using soldering.

As has been discussed, the present invention is a mounting structure including the semiconductor package 101 having the first electrodes 102, the circuit board 105 having the second electrodes 104, the bonding material 106 that is disposed between the second electrodes 104 and the bumps 103 formed on the first electrodes 102 and electrically bonds the first electrodes 102 and the second electrodes 104 through the bumps 103, the reinforcing resin covering the circuit board 105 and the outer periphery of the semiconductor package 101 disposed over the circuit board 105, and the reinforcing resin particularly covering the circumference of the bonding material so as to be applied over the joints of the bumps 103 and the bonding material 106, improving the drop resistance. In other words, the present invention is applicable to mobile devices such as a cellular phone. Moreover, the reflow achievable temperature in the fabrication of the mounting structure is lower than that of the conventional structure. Thus, the present invention is useful for environmental issues, particularly, global warming.

In other words, a point in fabricating the mounting structure of the present invention is that a desirable relationship is established among the bump 103 formed on the first electrode 102 of the semiconductor package 101, the reaction starting temperature of the thermosetting resin contained in the mixed paste 301 of the solder material and the uncured thermosetting resin, and the reaction starting temperature of the reinforcing resin 108. The relationship is shown below.

The desirable relationship is: the melting point of the bump 103 formed on the first electrode 102>the reaction starting temperature of the reinforcing resin 108≥the reaction starting temperature of the thermosetting resin contained in the mixed paste 301>the melting point of the solder material.

Furthermore, it is understood that the drop resistance of the mounting structure fabricated under these conditions is equal to that of a conventional soldering method, that is, a technique of improving the drop resistance of joints by fixing a EGA and a circuit board with a reinforcing resin material filled between the EGA and the circuit board after soldering (FIG. 6(D)) (Patent Literature 1).

As has been discussed, the mounting structure and the method for manufacturing the same according to the present invention can improve the drop resistance of the joints between the semiconductor package and the circuit board. A SnBi solder material having a lower melting point than conventional SnAgCu solder can be used for mobile devices such as a cellular phone.
(Second Embodiment)

FIGS. 4(A) to 4(D) show another method for manufacturing a mounting structure 100.

In the manufacturing process of the first embodiment shown in FIG. 2, the semiconductor package 101 is mounted on the circuit board 105, and then the reinforcing resin 108 is applied by the dispenser 302 before reflowing. A second embodiment is different from the first embodiment in that reinforcing resin 108 is applied to a circuit board 105 before a semiconductor package 101 is mounted on the circuit board 105. Other configurations are identical to those of the first embodiment.

In FIG. 4(A), mixed paste 301 is printed on second electrodes 104 of the circuit board 105.

Subsequently, in FIG. 4(B), the reinforcing resin 108 is applied by a dispenser 302 to a peripheral region where the semiconductor package 101 is mounted on the circuit board 105.

After that, in FIG. 4(C), the semiconductor package 101 is mounted on the circuit board 105 such that bumps 103 formed on first electrodes 102 of the semiconductor package 101 are brought into contact with the mixed paste 301 printed on the circuit board 105.

Subsequently, in FIG. 4(D), the mixed paste 301 and the reinforcing resin 108 are heated using a reflow device, melting the mixed paste 301. This separates a bonding material 106 and a reinforcing resin 107 from the mixed paste 301. This connects the first electrodes 102 and the second electrodes 104 via the bumps 103 and the bonding material 106 and covers the bonding material 106 and a boundary between the bonding material 106 and the bump 103 with the reinforcing resin 107. The reinforcing resin 108 covers the outer periphery of the semiconductor package 101 and forms a fillet between the circuit board 105 and the reinforcing resin 108.

Thus, the mounting structure 100 shown in FIG. 1 can be also manufactured by the manufacturing method in FIG. 4.
(Third Embodiment)

Figure 5A:
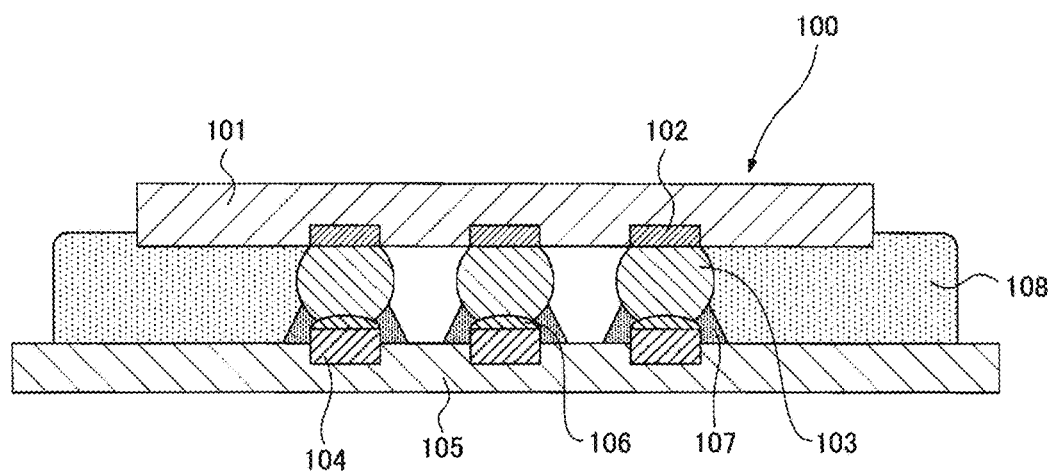
FIG. 5A is a cross-sectional view of a mounting structure according to a third embodiment of the present invention.
Figure 5B:
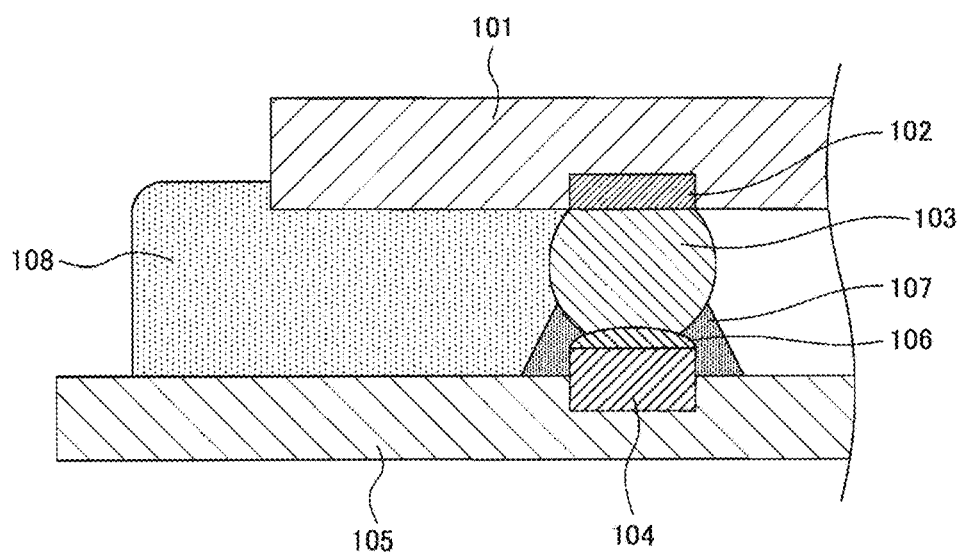
FIG. 5B is an enlarged view of the principal part of the mounting structure according to the third embodiment of the present invention.

FIGS. 5A and 5B show a mounting structure according to a third embodiment of the present invention.

FIG. 5A is a cross-sectional view of a semiconductor package 101 of a mounting structure 100 obtained by the mounting method of the second embodiment according to the present invention. FIG. 5B is an enlarged view of the left end of FIG. 5A.

In the mounting structure 100 of the first embodiment, an inner circumference 110 of the reinforcing resin 108 is not in contact with the reinforcing resin 107 or the bumps 103, whereas in the third embodiment, a reinforcing resin 108 is in contact with the semiconductor package 101, bumps 103 formed on first electrodes, a reinforcing resin 107 that reinforces a bonding material 106 electrically connecting the first electrodes and second electrodes via the bumps, and a circuit board 105. The reinforcing resin 108 and the reinforcing resin 107 preferably have the same components.

The reinforcing resin 108 is preferably an epoxy resin. Since the reinforcing resin 108 and the reinforcing resin 107 have the same components, the reaction starting temperatures of the resins can be easily adjusted by a heat effect during reflowing. Even if the components of the reinforcing resin 108 during curing are mixed with those of the reinforcing resin 107 that reinforces the bonding material 106 electrically connecting the first electrodes and the second electrodes via the bumps, the physical properties of the resins are easily kept as a curing material.

The mounting structure 100 of the third embodiment can be manufactured by increasing the amount of the reinforcing resin 108 in the step of FIG. 2(C) or FIG. 4(B).

The mounting structure of the third embodiment has higher drop resistance than that of the first embodiment.

INDUSTRIAL APPLICABILITY

The present invention contributes to an improvement in the reliability of mobile devices such as a cellular phone.

REFERENCE SIGNS LIST

100 mounting structure
101 semiconductor package
102 first electrode
103 bump
104 second electrode
105 circuit board
106 bonding material
107 reinforcing resin (first reinforcing resin)
108 reinforcing resin (second reinforcing resin)
301 mixed paste
302 dispenser

The invention claimed is:

1. A method for manufacturing a mounting structure, the method comprising:
applying mixed paste of a bonding material and an uncured first reinforcing resin onto second electrodes on a circuit board;
mounting a semiconductor package on the second electrodes of the circuit board via bumps and the mixed paste;
applying a second reinforcing resin between an outer periphery of the semiconductor package and the circuit board;
separating the bonding material and the first reinforcing resin by heating the circuit board and the semiconductor package; and
melting the bonding material, expanding the bonding material with a wet surface to the bump, expanding the first reinforcing resin with a wet surface around the bonding material and the bump, and then curing the first reinforcing resin and the second reinforcing resin,
wherein a relationship as follows is satisfied: a melting point of the bump>a hardening reaction starting temperature of the second reinforcing resin>a hardening reaction starting temperature of the first reinforcing resin>a melting point of the bonding material, and a difference between the hardening reaction starting temperature of the first reinforcing resin and the hardening reaction starting temperature of the second reinforcing resin is 5° C. to 15° C.

2. The method for manufacturing a mounting structure according to claim 1, wherein the first reinforcing resin and the second reinforcing resin do not contact each other.

3. The method for manufacturing a mounting structure according to claim 1, wherein the second reinforcing resin contacts the semiconductor package and the circuit board.

4. The method for manufacturing a mounting structure according to claim 1, wherein the first reinforcing resin and the second reinforcing resin comprise a thermosetting resin and a curing agent.

5. A method for manufacturing a mounting structure, the method comprising:
applying mixed paste of a bonding material and an uncured first reinforcing resin onto second electrodes on a circuit board;
applying a second reinforcing resin to a peripheral region where a semiconductor package is mounted on the circuit board;
mounting the semiconductor package onto the mixed paste on the second electrodes of the circuit board via bumps;
separating the bonding material and the first reinforcing resin by heating the circuit board and the semiconductor package; and
melting the bonding material having a lower melting point than the bump, expanding the bonding material with a wet surface to the bump, expanding the first reinforcing resin with a wet surface around the bonding material and the bump, and then curing the first reinforcing resin and the second reinforcing resin,
wherein a relationship as follows is satisfied: a melting point of the bump>a hardening reaction starting temperature of the second reinforcing resin>a hardening reaction starting temperature of the first reinforcing resin>a melting point of the bonding material, and a difference between the hardening reaction starting temperature of the first reinforcing resin and the hardening reaction starting temperature of the second reinforcing resin is 5° C. to 15° C.

6. The method for manufacturing a mounting structure according to claim 5, wherein the first reinforcing resin and the second reinforcing resin do not contact each other.

7. The method for manufacturing a mounting structure according to claim 5, wherein the second reinforcing resin contacts the semiconductor package and the circuit board.

8. The method for manufacturing a mounting structure according to claim 5, wherein the first reinforcing resin and the second reinforcing resin comprise a thermosetting resin and a curing agent.

* * * * *